(12) United States Patent
Lin et al.

(10) Patent No.: US 12,015,030 B2
(45) Date of Patent: *Jun. 18, 2024

(54) GATE STACKS FOR SEMICONDUCTOR DEVICES OF DIFFERENT CONDUCTIVITY TYPES

(71) Applicant: Taiwan Semiconductor Manufacturing Company, Ltd., Hsinchu (TW)

(72) Inventors: Yih-Ann Lin, Hsinchu County (TW); Ryan Chia-Jen Chen, Hsinchu (TW); Donald Y. Chao, Hsinchu County (TW); Yi-Shien Mor, Hsinchu (TW); Kuo-Tai Huang, HsinChu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 130 days.

This patent is subject to a terminal disclaimer.

(21) Appl. No.: 17/705,944

(22) Filed: Mar. 28, 2022

(65) Prior Publication Data

US 2022/0216205 A1 Jul. 7, 2022

Related U.S. Application Data

(60) Continuation of application No. 15/961,935, filed on Apr. 25, 2018, now Pat. No. 11,289,481, which is a
(Continued)

(51) Int. Cl.
*H01L 27/092* (2006.01)
*H01L 21/28* (2006.01)
(Continued)

(52) U.S. Cl.
CPC ...... *H01L 27/092* (2013.01); *H01L 21/28088* (2013.01); *H01L 21/823842* (2013.01);
(Continued)

(58) Field of Classification Search
None
See application file for complete search history.

(56) References Cited

U.S. PATENT DOCUMENTS

| 5,783,478 A | 7/1998 | Chau et al. |
| 6,255,698 B1 | 7/2001 | Gardner et al. |

(Continued)

OTHER PUBLICATIONS

Park et al., "Robust Ternary Metal Gate Electrodes for Dual Gate CMOS Devices", IEEE, Technical Digest, International Electron Devices Meeting (IEDM'01), Dec. 2-5, 2001, pp. 30.6.1-30.6.4. Dec. 2, 2001.
(Continued)

*Primary Examiner* — Bilkis Jahan
(74) *Attorney, Agent, or Firm* — Haynes and Boone, LLP

(57) ABSTRACT

A semiconductor device includes a semiconductor substrate, an isolation structure in the semiconductor substrate for isolating a first active region and a second active region, a first device formed in the first active region, and a second device formed in the second active region. The first device has a first gate dielectric layer and a first gate electrode over the first gate dielectric layer. The first gate electrode includes at least one of Ta and C, and has a first work function for a first conductivity. The second device has a second gate dielectric layer and a second gate electrode over the second gate dielectric layer. The second gate electrode includes at least one of Ta, C, and Al, and has a second work function for a second conductivity. The second conductivity is different from the first conductivity.

20 Claims, 7 Drawing Sheets

Related U.S. Application Data continuation of application No. 14/013,960, filed on Aug. 29, 2013, now Pat. No. 9,960,160, which is a division of application No. 12/492,889, filed on Jun. 26, 2009, now Pat. No. 8,524,588.

(60) Provisional application No. 61/089,674, filed on Aug. 18, 2008.

(51) Int. Cl.
*H01L 21/8238* (2006.01)
*H01L 29/49* (2006.01)
*H01L 29/51* (2006.01)

(52) U.S. Cl.
CPC .... *H01L 21/28194* (2013.01); *H01L 29/4966* (2013.01); *H01L 29/517* (2013.01)

(56) References Cited

U.S. PATENT DOCUMENTS

| | | | |
|---|---|---|---|
| 6,265,258 B1 | 7/2001 | Liang et al. | |
| 6,291,282 B1 | 9/2001 | Wilk et al. | |
| 6,319,826 B1 | 11/2001 | Chen et al. | |
| 6,335,534 B1 | 1/2002 | Suguro et al. | |
| 6,423,619 B1 | 7/2002 | Grant et al. | |
| 6,458,695 B1 | 10/2002 | Lin et al. | |
| 6,483,151 B2 | 11/2002 | Wakabayashi et al. | |
| 6,506,676 B2 | 1/2003 | Park et al. | |
| 6,653,698 B2 | 11/2003 | Lee et al. | |
| 6,831,343 B2 | 12/2004 | Hu | |
| 6,835,639 B2 | 12/2004 | Rotondaro et al. | |
| 7,033,888 B2 | 4/2006 | Pan et al. | |
| 7,226,826 B2 | 6/2007 | Alshareef et al. | |
| 7,368,796 B2 | 5/2008 | Hu | |
| 7,391,085 B2 | 6/2008 | Ichihara | |
| 7,564,102 B2 | 7/2009 | Yoshihara | |
| 7,648,884 B2 | 1/2010 | Min et al. | |
| 2002/0001906 A1 | 1/2002 | Park | |
| 2002/0008261 A1* | 1/2002 | Nishiyama | H01L 21/823835 257/E21.507 |
| 2003/0003645 A1 | 1/2003 | Besser et al. | |
| 2004/0132296 A1 | 7/2004 | Lin et al. | |
| 2004/0245578 A1 | 12/2004 | Park et al. | |
| 2005/0148137 A1 | 7/2005 | Brask | |
| 2006/0097318 A1 | 5/2006 | Li | |
| 2006/0180870 A1 | 8/2006 | Ichihara | |
| 2007/0026621 A1* | 2/2007 | Cho | H01L 29/513 257/E21.679 |
| 2007/0037335 A1 | 2/2007 | Chambers et al. | |
| 2007/0037372 A1 | 2/2007 | Kavalieros et al. | |
| 2007/0059874 A1 | 3/2007 | Moumen et al. | |
| 2007/0138559 A1 | 6/2007 | Bohr | |
| 2007/0178633 A1 | 8/2007 | Adetutu | |
| 2007/0257302 A1 | 11/2007 | Kang et al. | |
| 2008/0029822 A1 | 2/2008 | Tsuchiya | |
| 2008/0128822 A1 | 6/2008 | Koyama | |
| 2009/0032963 A1* | 2/2009 | Tran | H01L 21/76816 257/774 |
| 2009/0057750 A1 | 3/2009 | Takashima | |
| 2009/0134469 A1* | 5/2009 | Chang | H01L 21/28097 257/369 |
| 2009/0162983 A1* | 6/2009 | Park | H01L 29/66795 257/E21.441 |
| 2009/0179279 A1* | 7/2009 | Basker | H01L 21/28176 205/261 |
| 2009/0263961 A1* | 10/2009 | Kher | C23C 16/45582 257/E21.159 |
| 2009/0315124 A1* | 12/2009 | Chen | H10B 99/00 257/411 |
| 2010/0068876 A1 | 3/2010 | Lin et al. | |
| 2014/0001566 A1 | 1/2014 | Lin et al. | |
| 2015/0228730 A1 | 8/2015 | Yang | |

OTHER PUBLICATIONS

Chinese Patent Office, Office Action dated Dec. 29, 2010, Application No. 20091016678.2, 4 pages.

Taiwan Patent Office, Office Action dated Oct. 18, 2012, Application No. 10121114350, 8 pages.

\* cited by examiner

GATE STACKS FOR SEMICONDUCTOR DEVICES OF DIFFERENT CONDUCTIVITY TYPES

PRIORITY

This is a continuation of U.S. application Ser. No. 15/961,935, filed on Apr. 25, 2018, which is a continuation of U.S. application Ser. No. 14/013,960, filed on Aug. 29, 2013, now issued U.S. Pat. No. 9,960,160, which is a divisional of U.S. application Ser. No. 12/492,889, filed on Jun. 26, 2009, now issued U.S. Pat. No. 8,524,588, which claims priority to U.S. Provisional Application Ser. No. 61/089,674 filed on Aug. 18, 2008. The entire disclosure of each of the applications above is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. There has been a desire to fabricate these devices with a metal material for the gate electrode and a high-k dielectric for the gate dielectric. However, an n-type MOS device (NMOS) and a p-type MOS device (PMOS) require different work functions for their respective gate electrode. Several approaches have been implemented to achieve N and P work functions, simultaneously, for the metal gates. One approach uses additional metal and/or cap layers for the gate stack to achieve both N and P work functions. Although this approach has been satisfactory for its intended purpose, it has not been satisfactory in all respects. For example, the approach increases the complexity of the gate stack in NMOS and PMOS devices, and thus increases the difficulty of patterning the gate stack.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
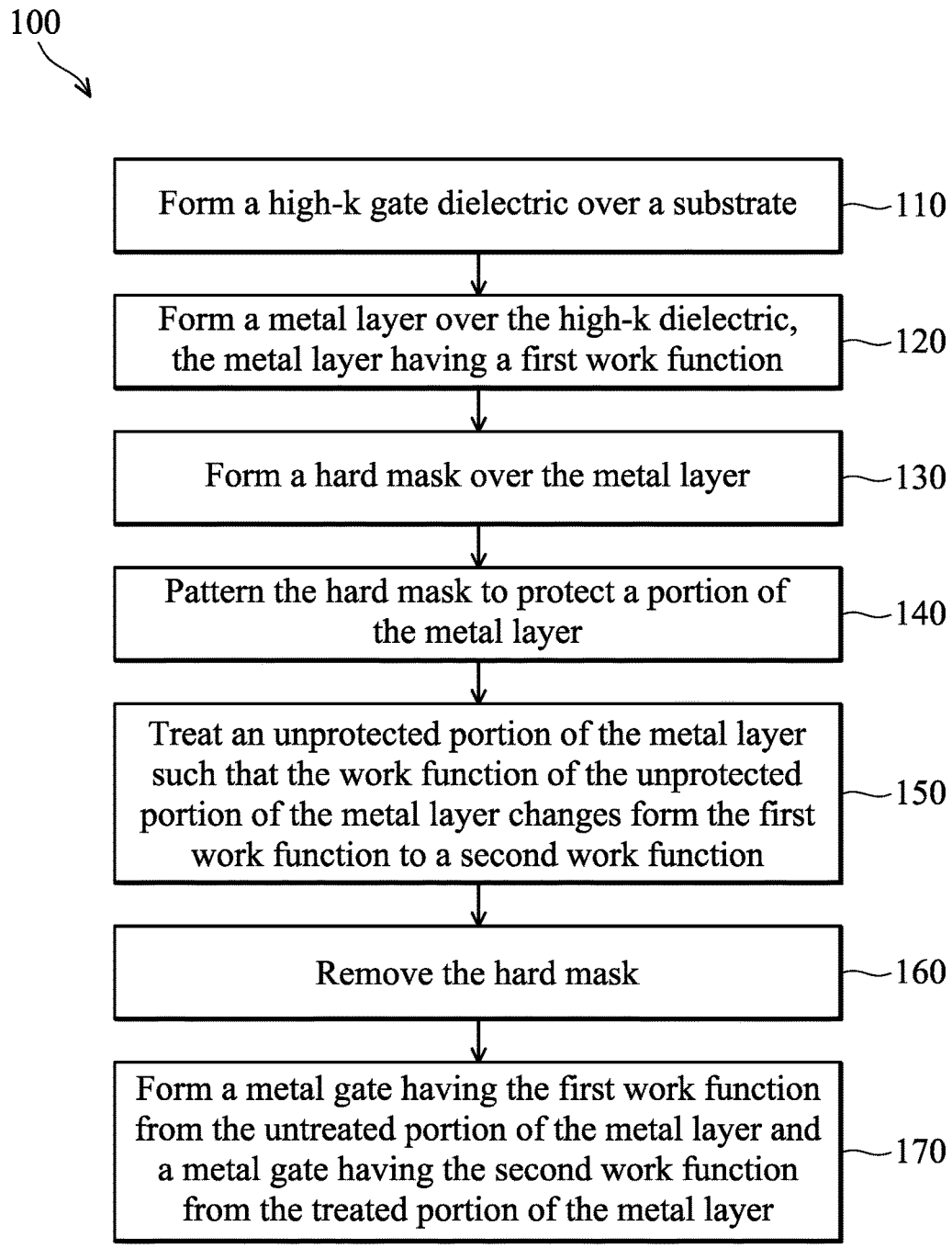
FIG. 1 is a flow chart illustrating a method for fabricating a semiconductor device in a high-k/metal gate process according to various aspects of the present disclosure.

Illustrated in FIG. 1 is a flowchart of a method 100 for fabricating a semiconductor device in a high-k/metal gate process. FIGS. 2A to 2F illustrate cross-sectional views of one embodiment of a semiconductor device 200 at various stages of fabrication according to the method 100 of FIG. 1. It is understood that FIGS. 2A to 2F have been simplified to better understand the inventive concepts of the present disclosure.

Figure 2A:
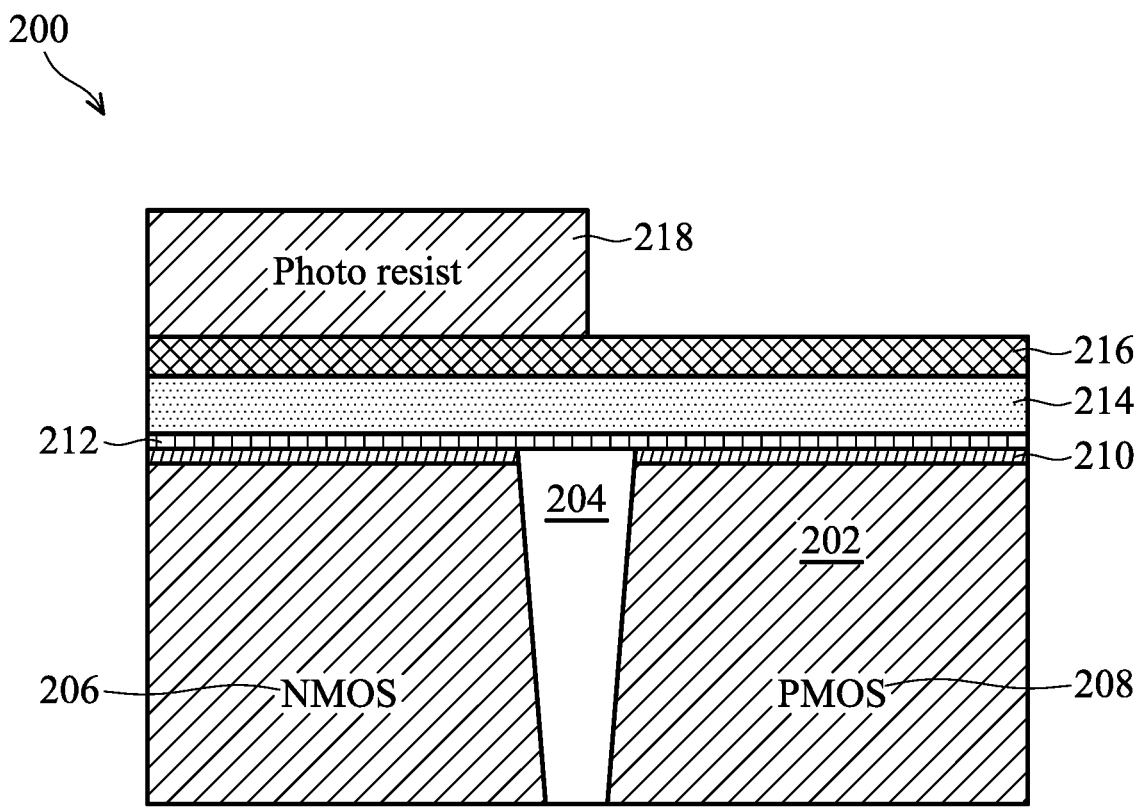
FIGS. 2A to 2F are cross-sectional views of a semiconductor device at various stages of fabrication according to the method of FIG. 1.

Referring to FIG. 1, the method 100 begins with block 110 in which a high-k dielectric material may be formed over a semiconductor substrate. Referring also to FIG. 2A, the semiconductor device 200 includes the semiconductor substrate 202 such as a silicon substrate. The substrate 202 may include various doping configurations depending on design requirements as is known in the art. The substrate 202 may also include other elementary semiconductors such as germanium and diamond. Alternatively, the substrate 202 may include a compound semiconductor and/or an alloy semiconductor. Further, the substrate 202 may optionally include an epitaxial layer (epi layer), may be strained for performance enhancement, and may include a silicon-on-insulator (SOI) structure.

The semiconductor device 200 may further include an isolation structure 204 such as a shallow trench isolation (STI) feature formed in the substrate 202 for isolating active regions 206 and 208 in the substrate. The isolation structure 204 may be formed of silicon oxide, silicon nitride, silicon oxynitride, fluoride-doped silicate (FSG), and/or a low k dielectric material known in the art. The active region 206 may be configured for an N-type metal-oxide-semiconductor transistor device (referred to as NMOS) and the active region 208 may be configured for a P-type MOS transistor device (referred to as PMOS). It is understood the semiconductor device 200 may be formed by complementary MOS (referred to as CMOS) technology processing, and thus some processes are not described in detail herein. The semiconductor device 200 may further include an interfacial layer 210 formed over the substrate 202. The interfacial layer 210 may include a grown silicon oxide layer having a thickness ranging from about 5 to 10 angstrom (A). The semiconductor device 200 may further include a high-k dielectric layer 212 formed on the interfacial layer 210. The high-k dielectric layer 212 may include hafnium oxide ($HfO_2$). Alternatively, the high-k dielectric layer 212 may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof.

The high-k dielectric layer 212 may be formed by atomic layer deposition (ALD) or other suitable technique. Additionally, a capping layer may be formed on the high-k dielectric layer 212, or may be formed between the high-k dielectric layer 212 and interfacial layer 210, or may be formed on and underneath the high-k dielectric layer 212. The capping layer may include lanthanum oxide (LaO), aluminum oxide ($Al_2O3$), or other suitable material. In some embodiments, the capping layer may be used to tune a work function of a metal layer (for the gate electrode) for properly performing as an NMOS transistor device and a PMOS transistor device, respectively.

The method 100 continues with block 120 in which a metal layer may be formed over the high-k dielectric layer. The metal layer 214 may have a first work function such as an N-metal work function. For example, the metal layer 214 may include various metals, such as TiN, TaC, or TaN, having the N-metal work function. The metal layer 214 may be formed by various deposition techniques such as chemical vapor deposition (CVD), physical vapor deposition (PVD or sputtering), plating, or other suitable technique. The method 100 continues with block 130 in which a hard mask layer 216 may be formed over the metal layer 214. The hard mask layer 216 may include silicon oxide, silicon oxynitride, silicon nitride, or other suitable material.

Figure 2B:
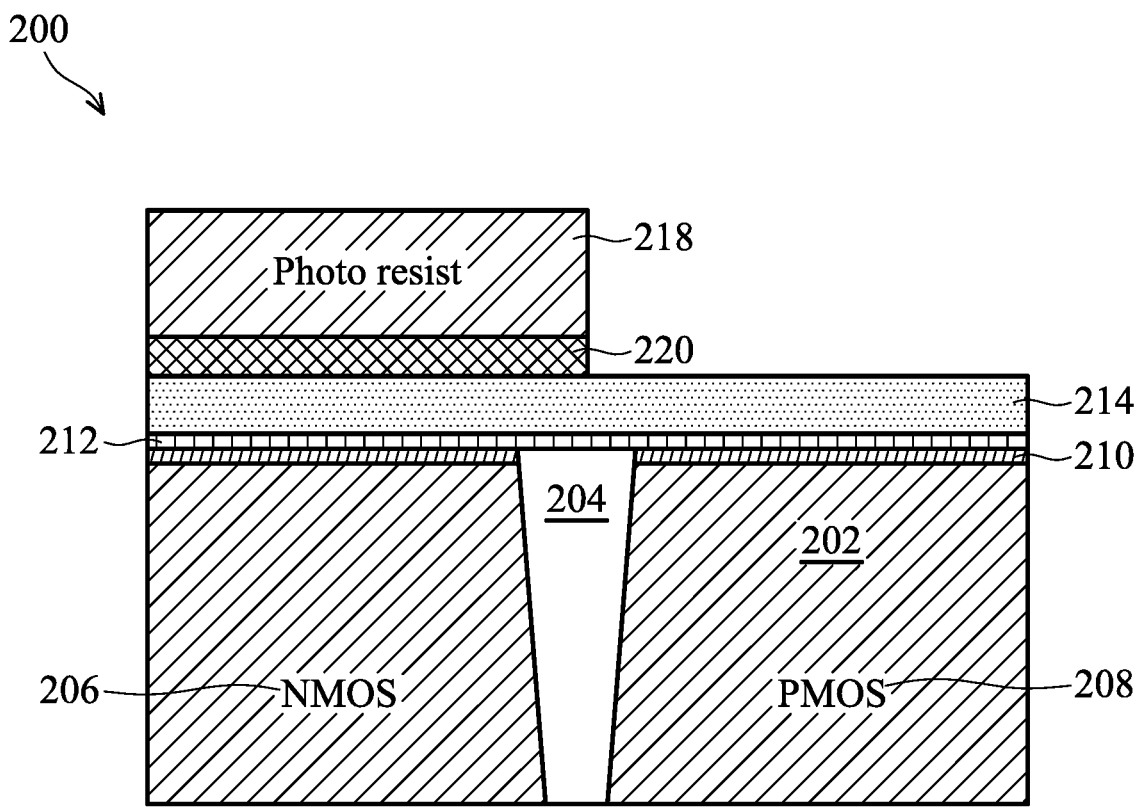

The method 100 continues with block 140 in which the hard mask layer 216 may be patterned to protect a portion of the metal layer 214 in the NMOS region 206. The hard mask 216 may be patterned by first forming a patterned photoresist layer 218 over the hard mask layer 216, and then dry or wet etching to remove a portion of the hard mask layer 216 in the PMOS region 208. The patterned photoresist layer 218 may be formed by photolithography, immersion lithography, or other suitable process known in the art. For example, the photolithography process may include spin coating, soft-baking, exposure, post-baking, developing, rinsing, drying, and other suitable process. Referring also to FIG. 2B, the portion of the hard mask that is not protected by the patterned photoresist 218 may be removed by the etching process, and thus a portion 220 of the hard mask remains overlying the NMOS region 206. The patterned photoresist 218 may be removed by a stripping process or other suitable process.

Figure 2C:
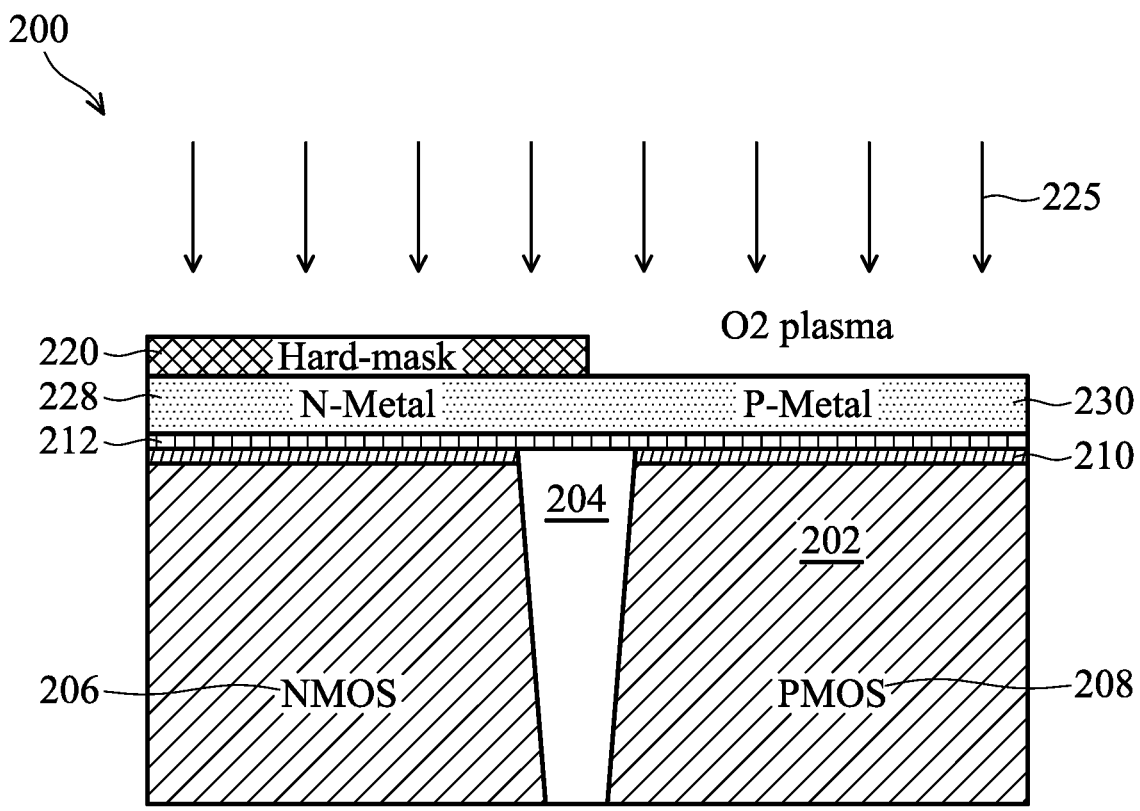

Referring also to FIG. 2C, the method 100 continues with block 150 in which the unprotected portion of the metal layer may be treated such that the unprotected portion changes from the first work function to a second work function. In the present example, the unprotected portion 230 may be treated 225 with a plasma such that the work function changes (or adjusts) from an N-metal work function to a P-metal work function. Accordingly, the protected portion 228 of the metal layer remains unchanged with an N-metal work function. For example, the plasma treatment may include an $O_2$ plasma with the following process conditions: source power ranging from about 300 to 600 W, bias power ranging from about 0 to 20 W, pressure at about 7.5 mtorr, gas flow including 30 sccm $O_2$/0 to 130 sccm Ar, and process time ranging from about 30 to 100 seconds. In another example, the plasma treatment may include $N_2$ plasma.

In another embodiment, the treatment 225 may include an implantation process. For example, the implantation process may include O implantation with the following process conditions: implant energy ranging from 1 to 5 KeV, implant concentration ranging from about 1E15 to 1E16 atoms/$cm^3$, and implant tilt angle of about 7 degrees. In another example, the implantation process may include Al implantation with the following process conditions: implant energy ranging from about 1 to 5 KeV, implant concentration ranging from about 1E15 to 1E16 atoms/$cm^3$, and implant tilt angle of about 7 degrees. In some embodiments, the Al concentration in TiN for N-metal work function may be n-TiAlN having 30% [N] and 17.5% [Al], and for P-metal work function may be p-TiAlN having 50% [N] and 12.5% [Al]. Also, a combination of a plasma process and an implantation process may be used. It is understood that the various parameters and concentrations disclosed above are examples, and that these parameters and concentrations may be tuned for optimization depending on the process tools and the operating environment without departing from the spirit and scope of the present disclosure.

Figure 2D:
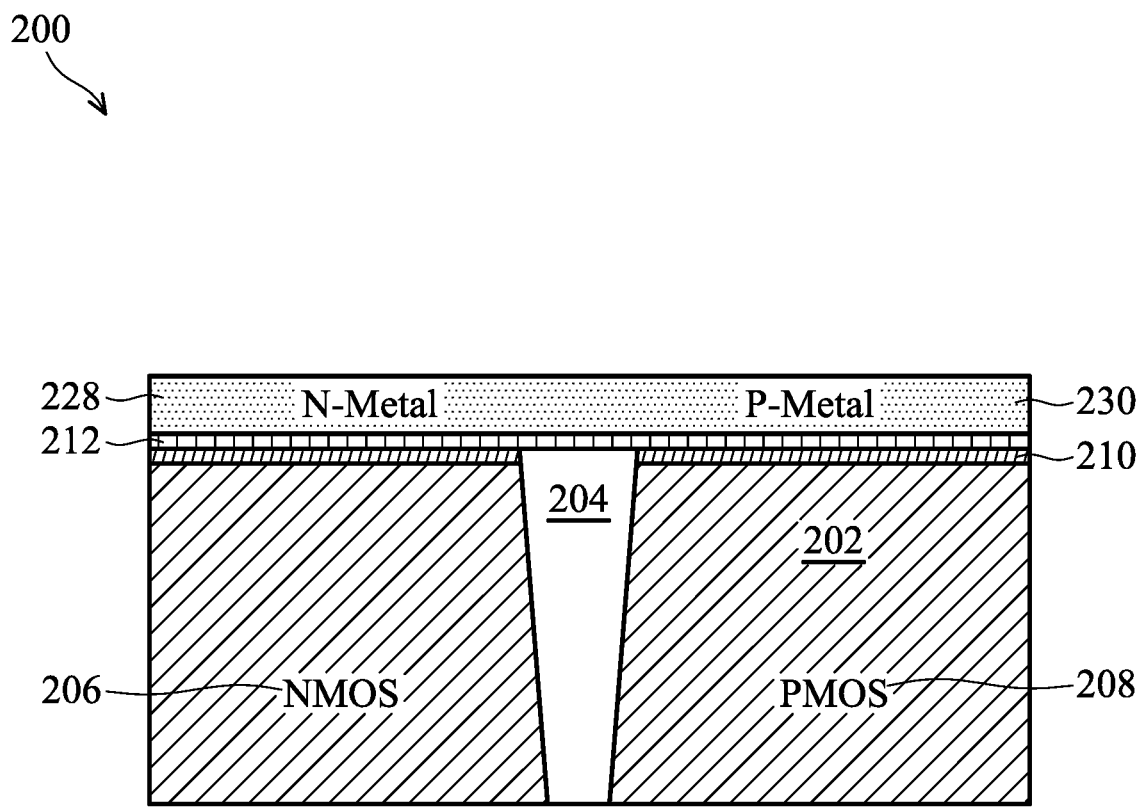
Figure 2E:
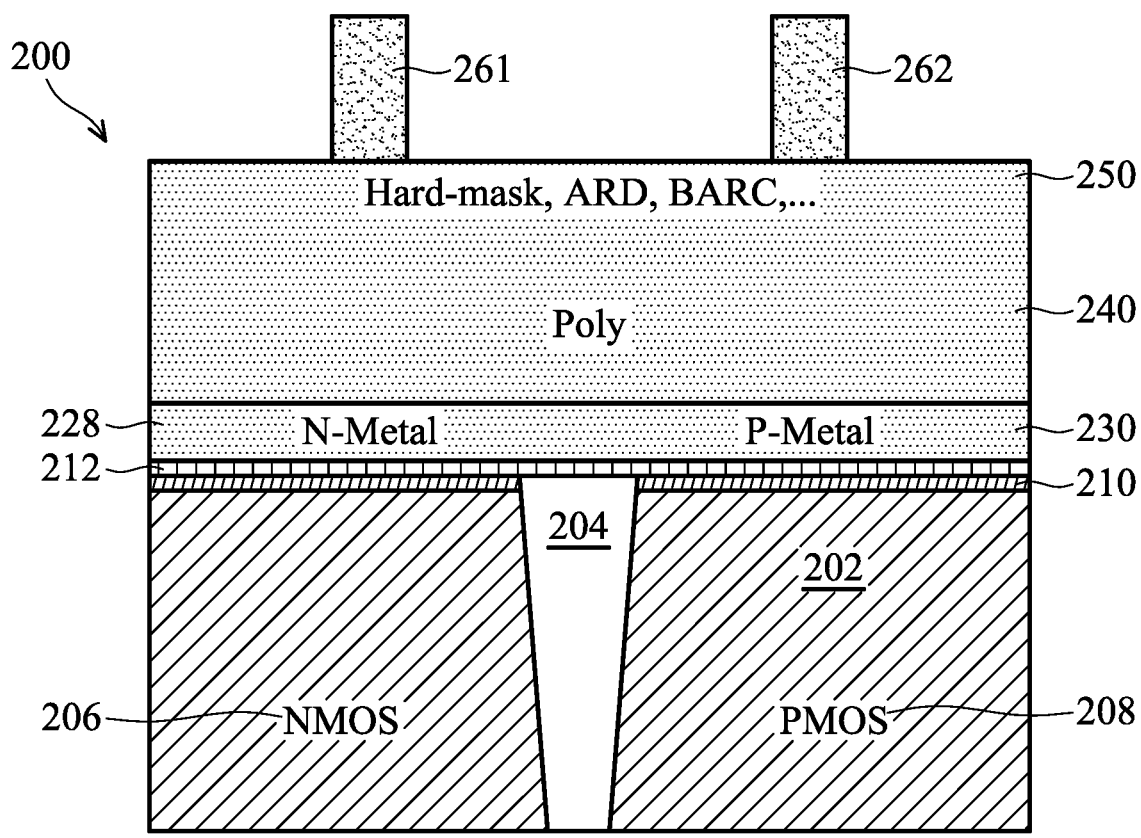

Referring also to FIG. 2D, the method 100 continues with block 160 in which the hard mask 220 may be removed. The hard mask 220 may be removed by a wet or dry etch process known in the art. Referring also to FIG. 2E, the method 100 continues with block 170 in which a metal gate having the first work function may be formed from the untreated portion of the metal layer, and a metal gate having the second work function may be formed from the treated portion of the metal layer. Following the removal of the hard mask 220, a polysilicon (or poly) layer 240 may be formed over the N-metal 228 and the P-metal 230 by a suitable deposition process. A hardmask layer 250 may be formed over the poly layer 240. The hard mask layer 250 may include SiN, SiON, SiC, SiOC/PEOX, TEOS, or other suitable material. Additionally, an anti-reflective coating or bottom anti-reflective coating (BARC) may be formed on the hard mask layer 250 as is known in the art. A patterned photoresist layer may be formed with a gate pattern 261 for the NMOS region 206 and a gate pattern 262 for the PMOS region 208. The gate patterns 261, 262 may be formed by photolithography, immersion lithography, or other suitable process as was discussed above.

Figure 2F:
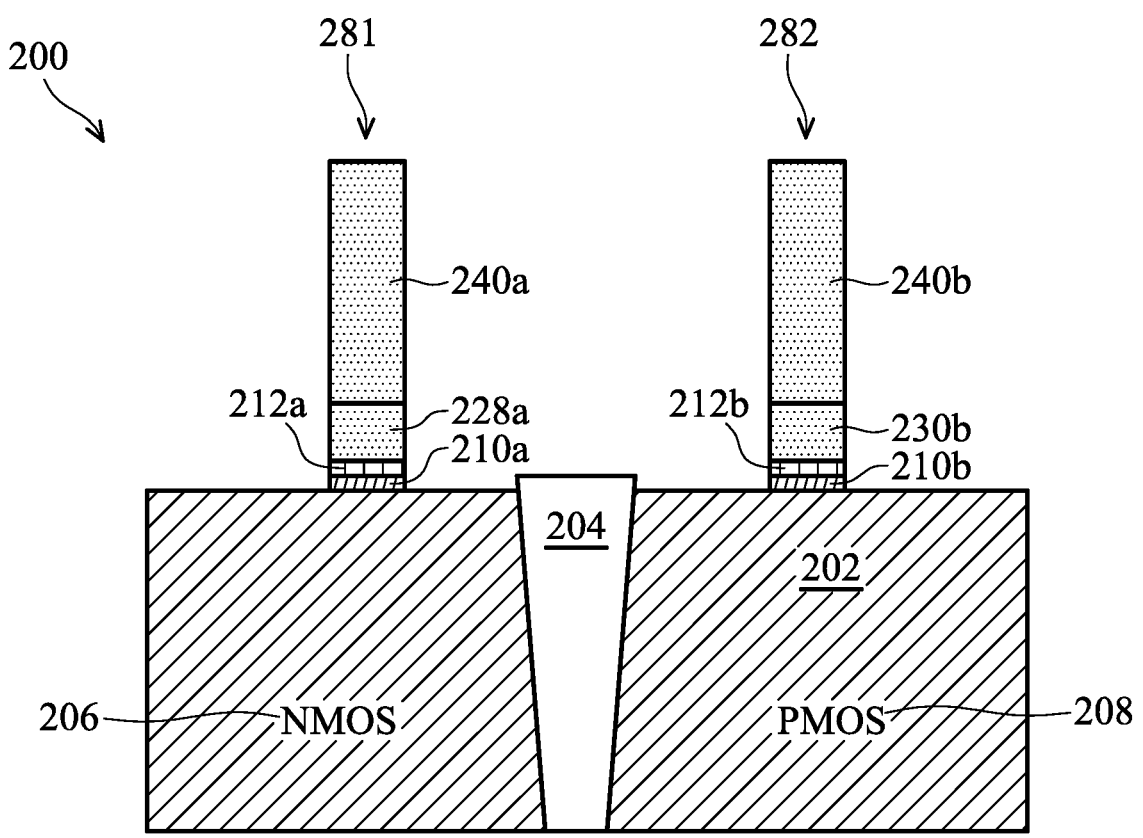

Referring also to FIG. 2F, the hard mask layer 250 may be patterned by a dry or wet etching process using the gate patterns 261, 262, and the patterned hard mask layer may be used to pattern a gate stack 281 in the NMOS region 206 and a gate stack 282 in the PMOS region 208. The gate stacks 281, 282 may be formed by a dry or wet etching process (e.g., gate patterning). The gate stack 281 in the NMOS region 206 may include a poly layer 240a, an N-metal 228a, a high-k dielectric 212a (with or without a capping layer), and an interfacial layer 210a. The gate stack 282 in the PMOS region 208 may include a poly layer 240b, a P-metal 230b, a high-k dielectric 212b (with or without a capping layer), and an interfacial layer 210b. It should be noted that prior to the gate patterning, the N-metal layer 228 and the P-metal layer 230 may have a similar composition and thickness, and thus gate patterning in the NMOS region 206 and the PMOS region 208 becomes less difficult as compared to pattering gate stacks with varying thicknesses.

It is understood that the semiconductor device 200 may undergo further CMOS or MOS technology processing to form various features known in the art. For example, gate sidewall spacers may be formed on both sides of the gate stacks 281, 282 by a deposition and etching process. The gate spacers may include a suitable dielectric material such as silicon nitride, silicon oxide, silicon carbide, silicon oxynitride, or combinations thereof. In another example, source and drain regions (referred to as S/D regions) may be formed in the substrate 202 using ion implantation or diffusion with suitable dopants (depending on the configuration of the device such as NMOS and PMOS) and located proximate to each end of the gate stacks 281, 282 (the high-k gate dielectric and metal gate electrode), respectively. In still another example, various contacts/vias and multilayer interconnect features (e.g., metal layers and interlayer dielectric) may be formed on the substrate 202 and configured to connect the various features or structures of the semiconductor device 200.

The present invention achieves different advantages in various embodiments. For example, the present disclosed method provides a simple and cost-effective single metal layer that performs both N-metal work function and P-metal work function for NMOS and PMOS devices, respectively. Accordingly, patterning the gate structures for NMOS and PMOS devices becomes easier since the corresponding gate stacks have a similar composition and thickness. Accordingly, performance of the NMOS and PMOS transistor devices may become more reliable and predictable. Also, the methods disclosed herein are compatible with current CMOS technology process flow, and thus can easily be integrated with current processing equipment and device technologies. It is understood that different embodiments disclosed herein offer several different advantages, and that no particular advantage is necessarily required for all embodiments.

Thus, the present disclosure provide a method of fabricating a semiconductor device that includes forming a gate dielectric over a semiconductor substrate, forming a capping layer over or under the gate dielectric, forming a metal layer over the capping layer, the metal layer having a first work function, treating a portion of the metal layer such that a work function of the portion of the metal layer changes from the first work function to a second work function, and forming a first metal gate from the untreated portion of the metal layer having the first work function and forming a second metal gate from the treated portion of the metal layer having the second work function.

Also provided is a semiconductor device that includes a semiconductor substrate, an isolation structure formed in the substrate for isolating a first active region and a second active region, a first transistor formed in the first active region, the first transistor having a high-k gate dielectric, a first capping layer formed over or under the high-k gate dielectric, and a metal gate with a first work function formed over the first capping layer, and a second transistor formed in the second active region, the second transistor having the high-k gate dielectric, a second capping layer formed over or under the high-k gate dielectric, and a metal gate with a second work function formed over the second capping layer. The metal gates of the first transistor and the second transistor are formed from at least a single metal layer having the first work function and the second work function.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments have been described in a gate first process, the methods disclosed herein are also applicable in a gate last process or a hybrid process that includes both gate first and gate last processes. Further, it is understood that the semiconductor devices disclosed herein are not limited to a specific transistor and may include other active and passive devices such as a finFET transistor, a high voltage transistor, a bipolar junction transistor (BJT), a capacitor, a resistor, a diode, a fuse, or combinations thereof.

What is claimed is:

1. A semiconductor device comprising:
a semiconductor substrate;
a first active region and a second active region in the semiconductor substrate;
a first device formed in the first active region, the first device having a first gate dielectric layer and a first gate electrode, wherein the first gate electrode has a first work function for a first conductivity; and
a second device formed in the second active region, the second device having a second gate dielectric layer and a second gate electrode, wherein the second gate electrode has a second work function and includes Al at a concentration such the second gate electrode has a second conductivity opposite from the first conductivity, wherein the first gate electrode and second gate electrodes are formed from first and second portions of a material layer, respectively, wherein the first portion of the material layer is not treated with an Al implantation process and the second portion of the material layer is treated with an Al implantation process.

2. The semiconductor device of claim 1, wherein the first work function is an N-metal work function and the second work function is a P-metal work function.

3. The semiconductor device of claim 1, wherein the first gate electrode includes TaC.

4. The semiconductor device of claim 1, wherein the first and second gate dielectric layers includes one of hafnium oxide (HfO2), hafnium silicon oxide (HfSiO), hafnium silicon oxynitride (HfSiON), hafnium tantalum oxide (HMO), hafnium titanium oxide (HMO), hafnium zirconium oxide (HfZrO), and combinations thereof.

5. The semiconductor device of claim 1, wherein the first and second devices each includes a capping layer and the capping layers comprise lanthanum oxide and aluminum oxide.

6. The semiconductor device of claim 1, wherein the first device further includes an interfacial layer under the first gate dielectric layer.

7. The semiconductor device of claim 6,
wherein the first active region is isolated from the second active region by an isolation structure,
wherein the interfacial layer and the isolation structure are spaced apart.

8. A semiconductor device comprising:
a semiconductor substrate having a first active region and a second active region;
an isolation structure isolating the first and second active regions;
a first gate stack in the first active region, the first gate stack having a first high-k gate dielectric layer and a first gate electrode layer, wherein the first gate electrode layer has a first work function for a first conductivity; and
a second gate stack in the second active region, the second gate stack having a second high-k gate dielectric layer and a second gate electrode layer, wherein the second gate electrode layer has a second work function and includes Al at a concentration such that the second gate electrode layer has a second conductivity that is opposite from the first conductivity, wherein the first gate electrode layer is formed from a first portion of a material layer that is not treated with an Al implantation process, wherein the second gate electrode layer is formed from a second portion of the material layer after being treated with the Al implantation process.

9. The semiconductor device of claim 8, wherein the first gate electrode layer and the second gate electrode layer include about the same Ta contents and about the same C contents.

10. The semiconductor device of claim 9, wherein the Al contents in the second gate electrode layer is introduced by ion implantation.

11. The semiconductor device of claim 8, wherein the second work function is greater than the first work function.

12. The semiconductor device of claim 8, wherein each of the first and second high-k gate dielectric layers includes hafnium oxide, hafnium silicon oxide, hafnium silicon oxynitride, hafnium tantalum oxide, hafnium titanium oxide, hafnium zirconium oxide, or a combination thereof.

13. The semiconductor device of claim 8, wherein the first gate stack further includes an interfacial layer under the first high-k gate dielectric layer, and the second gate stack further includes the interfacial layer under the second high-k gate dielectric layer.

14. The semiconductor device of claim 8, wherein the first gate stack further includes a poly layer over the first gate electrode layer, and the second gate stack further includes the poly layer over the second gate electrode layer.

15. A semiconductor device comprising:
a semiconductor substrate having a first region and a second region;
a first gate stack in the first region, the first gate stack having a first high-k gate dielectric layer and a first work function layer, wherein the first work function layer has a first work function for a first conductivity; and
a second gate stack in the second region, the second gate stack having a second high-k gate dielectric layer and a second work function layer, wherein the second work function layer has a second work function and has a second conductivity that is opposite the first conductivity, wherein the first work function layer is formed from a first portion of a TaC layer that is not treated with an Al implantation process, wherein the second work function layer is formed from a second portion of the TaC layer after being treated with the Al implantation process.

16. The semiconductor device of claim 15, wherein the first and second work function layers have about the same TaC contents.

17. The semiconductor device of claim 15, wherein the Al contents in the second work function layer are introduced by ion implantation.

18. The semiconductor device of claim 15, wherein the Al contents in the second work function layer are introduced by plasma treatment.

19. The semiconductor device of claim 15, wherein each of the first and second gate stacks further includes an interfacial layer under the first and second high-k gate dielectric layers, respectively.

20. The semiconductor device of claim 15, wherein the first and second work function layers have about the same height.

* * * * *